United States Patent
Ishida et al.

(10) Patent No.: US 8,237,065 B2
(45) Date of Patent: Aug. 7, 2012

(54) TWIN-CHIP-MOUNTING TYPE DIODE

(75) Inventors: Jun Ishida, Osaka (JP); Kenji Hamano, Osaka (JP); Masayuki Kusumoto, Osaka (JP)

(73) Assignee: Onamba Co., Ltd. (JP)

( * ) Notice: Subject to any disclaimer, the term of this patent is extended or adjusted under 35 U.S.C. 154(b) by 325 days.

(21) Appl. No.: 12/513,490

(22) PCT Filed: Jan. 25, 2008

(86) PCT No.: PCT/JP2008/000094
§ 371 (c)(1),
(2), (4) Date: May 4, 2009

(87) PCT Pub. No.: WO2009/022441
PCT Pub. Date: Feb. 19, 2009

(65) Prior Publication Data
US 2010/0084183 A1    Apr. 8, 2010

(30) Foreign Application Priority Data
Aug. 13, 2007 (JP) ................... 2007-210589

(51) Int. Cl.
*H05K 5/02* (2006.01)
*H05K 1/02* (2006.01)
*H05K 1/18* (2006.01)
*H01L 23/48* (2006.01)

(52) U.S. Cl. .............. 174/520; 257/753; 257/E23.01; 174/252; 174/260

(58) Field of Classification Search .......... 174/520
See application file for complete search history.

(56) References Cited

U.S. PATENT DOCUMENTS

| 7,388,269 | B2 * | 6/2008 | Sato et al. .............. 257/433 |
| 2003/0193322 | A1 * | 10/2003 | Higashikozono et al. .... 323/299 |
| 2005/0268958 | A1 * | 12/2005 | Aoyama ................. 136/244 |
| 2007/0221919 | A1 | 9/2007 | Sato et al. |
| 2008/0011348 | A1 * | 1/2008 | Aoyama et al. .......... 136/244 |
| 2008/0190477 | A1 * | 8/2008 | Hattori ................ 136/246 |

FOREIGN PATENT DOCUMENTS

| EP | 1753033 | 2/2007 |
| JP | 2005-251962 | 9/2005 |
| JP | 2006-165227 | 6/2006 |
| WO | 2005/112133 | 11/2005 |

OTHER PUBLICATIONS

WIPO (Japanese Patent Office), International Search Report for PCT/JP2008/000094, May 20, 2009 (2 pages).
WIPO (Japanese Patent Office), International Preliminary Report on Patentablity for PCT/JP2008/000094 (4 pages), Aug. 21, 2008.

* cited by examiner

*Primary Examiner* — Timothy Thompson
*Assistant Examiner* — Hiram E Gonzalez
(74) *Attorney, Agent, or Firm* — Kolisch Hartwell, P.C.

(57) ABSTRACT

The present invention provides a diode that does not deteriorate its function even if it is used in an environment where the temperature change is considerable, such as in a terminal box for solar cell panel that is placed outdoors. A diode of twin-chip-mounting type in which each chip has a lead foot for being joined to a common terminal plate, wherein said lead feet are electrically connected with each other in a region of each lead foot from each chip to a portion wherein each lead foot is joined. The electrical connection of the lead feet is preferably formed by integral molding with each lead foot.

6 Claims, 4 Drawing Sheets

US 8,237,065 B2

TWIN-CHIP-MOUNTING TYPE DIODE

TECHNICAL FIELD OF THE INVENTION

The present invention relates to a twin-chip-mounting type diode that can ensure the performance even when a defect is generated in a joining portion of a lead foot by deformation of a terminal plate due to temperature change. In particular, the diode of the present invention is suitable for use in a terminal plate circuit within a terminal box for solar cell panel that is used in an environment where the temperature change is considerable.

BACKGROUND ART

Generally, in order to allow a diode to perform its function within a circuit, electrical connection is established by joining the lead foot of the diode to a terminal plate.

Electrical connection between the diode and the terminal plate is firm in a general use. However, in a terminal plate that is placed within a terminal box for solar cell panel, the terminal plate is used in an environment where the temperature change is considerable, so that the expansion and contraction of the terminal plate in a plane direction of the terminal plate occur frequently. This leads to a problem such that the joining part of the lead foot of the diode to the terminal plate cannot withstand the expansion or contraction and generates cracks, whereby the joining part is easily exfoliated.

In particular, in a terminal box for solar cell panel having a terminal plate that is enlarged for improvement of the effect of dissipating the heat of the diode, such as disclosed in Japanese Patent Application Laid-Open No. 2005-251962, the expansion and contraction of the terminal plate in a plane direction of the terminal plate are greatly transmitted to the joining part that joins the lead foot of the diode to the terminal plate, whereby the aforementioned problem has been conspicuously raised. Therefore, a method has been demanded in which the diode can be allowed to perform its function in a highly reliable state even in such an environment.

DISCLOSURE OF THE INVENTION

Problem that the Invention is to Solve

The present invention has been devised in view of the above circumstances of the prior art, and an object thereof is to provide a diode that does not deteriorate its function even if it is used in an environment where the temperature change is considerable, such as in a terminal box for solar cell panel that is placed outdoors, a terminal plate circuit having the diode joined thereto, and a terminal box for solar cell panel including the terminal plate circuit.

Means for Solving the Problem

The present inventors have made eager studies in order to achieve the aforementioned object, and have found out that, even when a defect is generated in a joining part of one lead foot in a twin-chip-mounting type diode having two lead feet connected to the same pole, one of the chips can perform its function, and that even if such a defect is generated, the two chips in the diode can be allowed to perform their function by electrically connecting the lead feet with each other in a region of each lead foot from each chip to a portion wherein each lead foot is joined, thereby completing the present invention.

That is, the present invention is a diode of twin-chip-mounting type in which each chip has a lead foot for being joined to a common terminal plate, wherein said lead feet are electrically connected with each other in a region of each lead foot from each chip to a portion wherein each lead food is joined. In a preferred embodiment of a diode of the present invention, the electrical connection of the lead feet is formed by integral molding with each lead foot.

Also, the present invention is a terminal plate circuit including the aforementioned diode and a terminal plate, where each lead foot of the diode is joined to a common terminal plate. In a preferred embodiment of the terminal plate circuit of the present invention, the terminal plate is enlarged so that the heat generated from the diode can be sufficiently dissipated.

Furthermore, the present invention is a terminal box for solar cell panel including the aforementioned terminal plate circuit.

Advantages of the Invention

Since the diode of the present invention is a twin-chip-mounting type having a special construction, the function thereof can be safely ensured without deteriorating the performance thereof even when a defect is generated at a joining portion of one lead foot. Further, even when a defect is generated in one chip besides the joining portion of one lead foot, the function thereof can be safely ensured. In particular, the diode of the present invention is especially suitable for use in a terminal plate circuit within a terminal box for solar cell panel that is used in an environment where the temperature change is considerable.

BEST MODE FOR CARRYING OUT THE INVENTION

A diode of the present invention is a twin-chip-mounting type diode in which two chips are mounted, and each of these chips has a lead foot for being connected to a common terminal plate. The reason why the twin-chip-mounting type diode is adopted is for coping with the defect of the chip by two chips and for coping with the defect of the joining portion of the lead foot by two lead feet, and is a result of searching for a diode having a plurality of lead feet that can be connected to the same pole. Therefore, unlike the typical method of using a twin-chip-mounting type diode, each lead foot of the diode of the present invention is used by being joined to the common terminal plate of the same pole.

The characteristic features of the twin-chip-mounting type diode of the present invention lies in that the lead feet are electrically connected with each other in a region of each lead foot from each chip to a portion wherein each lead foot is joined. The joining of the lead feet to the terminal plate can be carried out by a conventionally known method, and can be carried out, for example, by soldering, welding, mechanical coupling (clamping or the like), or combination of soldering and mechanical coupling.

Figure 1:
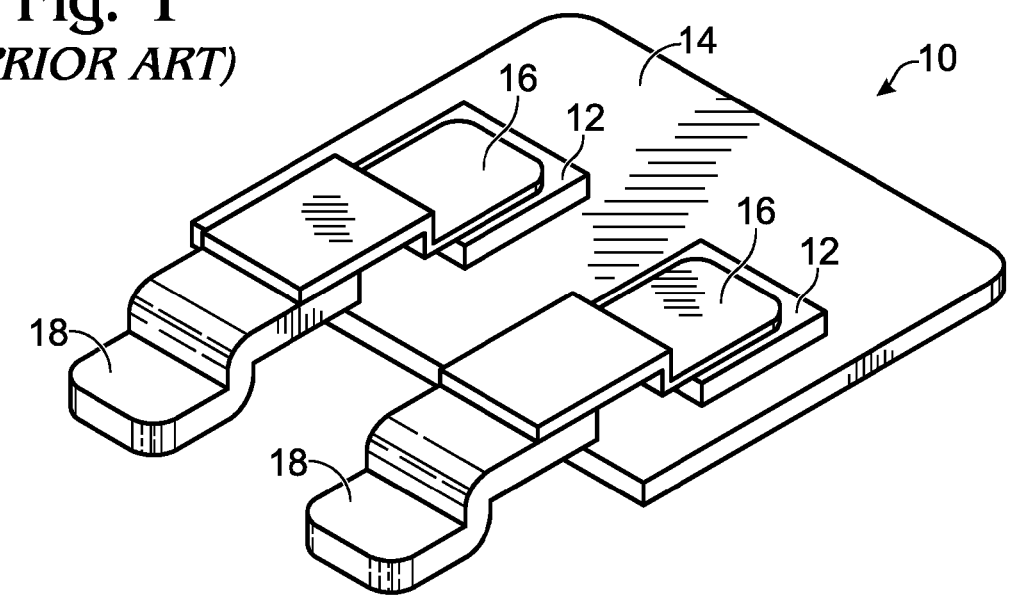
FIG. 1 is a view schematically illustrating a conventional twin-chip-mounting type diode while omitting illustration of a covering insulating resin.

As illustrated in the schematic view of FIG. 1 omitting the illustration of a covering insulating resin, the conventional twin-chip-mounting type diode 10 is adapted in such a manner that two chips 12 are independently mounted on a frame 14, and an inner lead foot 16 and an outer lead foot 18 are drawn out independently from each chip, and the tip end of the outer lead foot 18 is joined to the terminal plate. Therefore, when a defect is generated at the joining portion of one outer lead foot, only one chip functions because the joining portion of the other outer lead foot remains alive and the function of the diode is exhibited by the only one chip. This is not satisfactory in terms of the performance.

Figure 2:
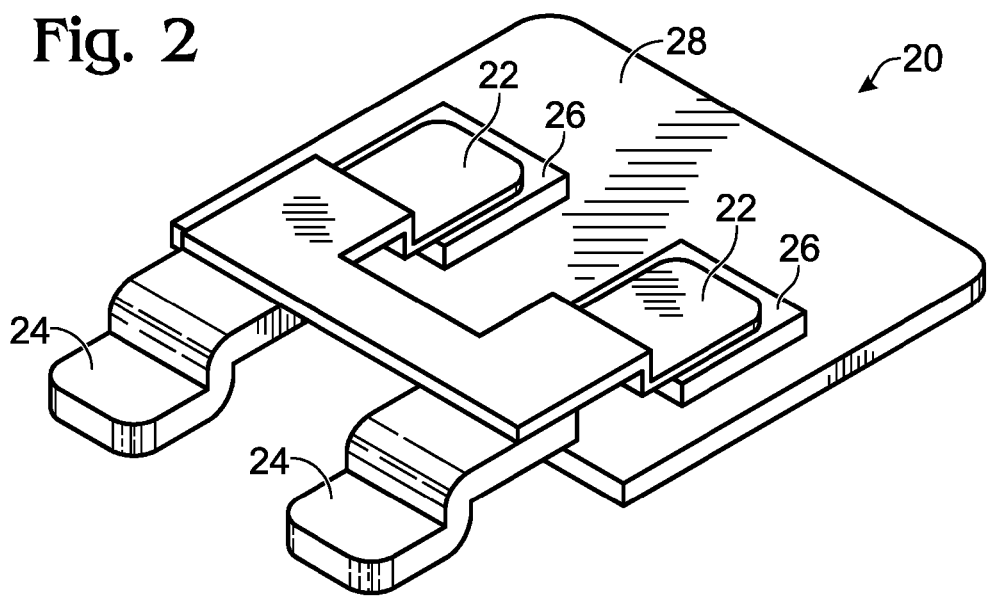
FIG. 2 is a view schematically illustrating an example of the twin-chip-mounting type diode of the present invention while omitting illustration of a covering insulating resin.

In contrast, in the twin-chip-mounting type diode 20 of the present invention, as illustrated, for example, in the schematic view of FIG. 2 omitting the illustration of a covering insulating resin, while an inner lead foot 22 and an outer lead foot 24 are drawn out independently from each of the two chips 26 that are independently mounted on a frame 28 in a similar manner and the tip end of the outer lead foot 24 is joined to the terminal plate, the inner lead feet 22 that have been drawn out from the two chips are integrally molded so as to be electrically connected with each other. Therefore, even when a defect is generated at the joining portion of one outer lead foot, an electric current can flow via the other outer lead foot and via the other inner lead foot to the inner lead foot of the side where the defect has been generated, so that the two chips function effectively, and no problem is raised in terms of the performance.

Figure 3:
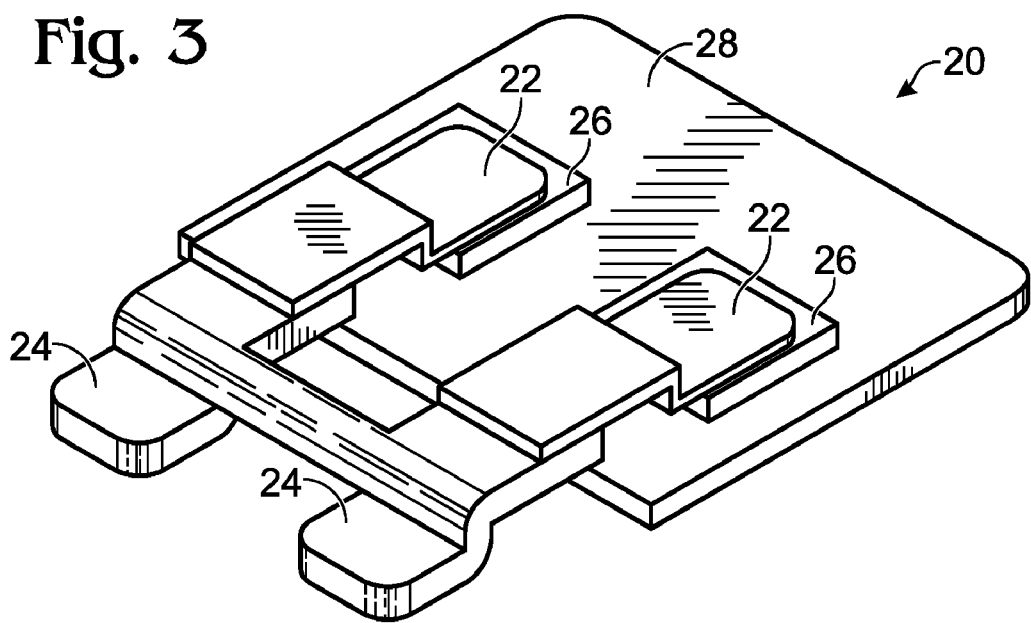
FIG. 3 is a view schematically illustrating an example of the twin-chip-mounting type diode of the present invention while omitting illustration of a covering insulating resin.
Figure 4:
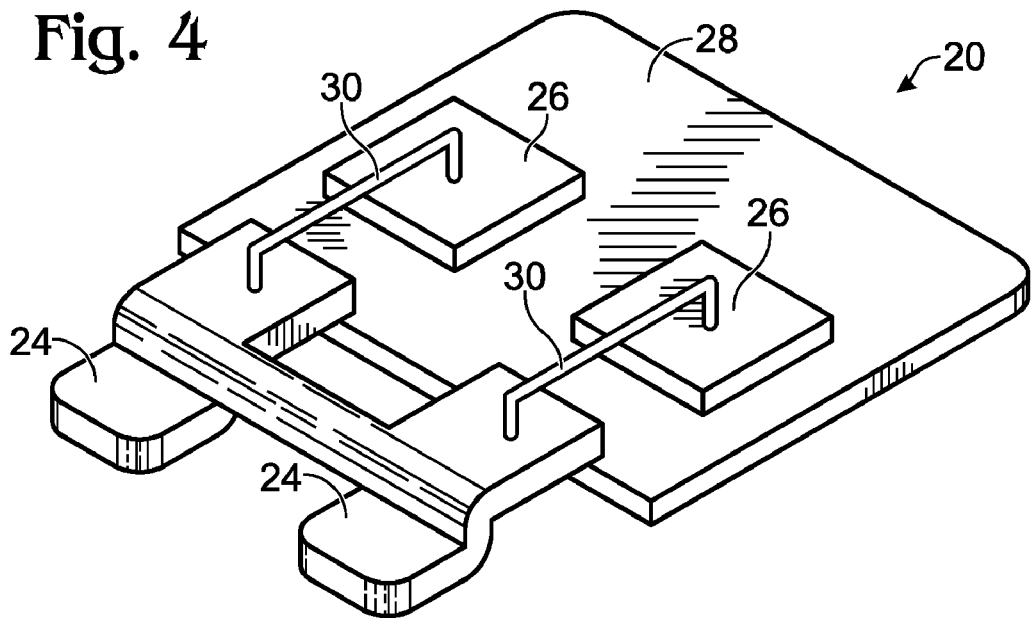
FIG. 4 is a view schematically illustrating an example of the twin-chip-mounting type diode of the present invention while omitting illustration of a covering insulating resin.
Figure 5:
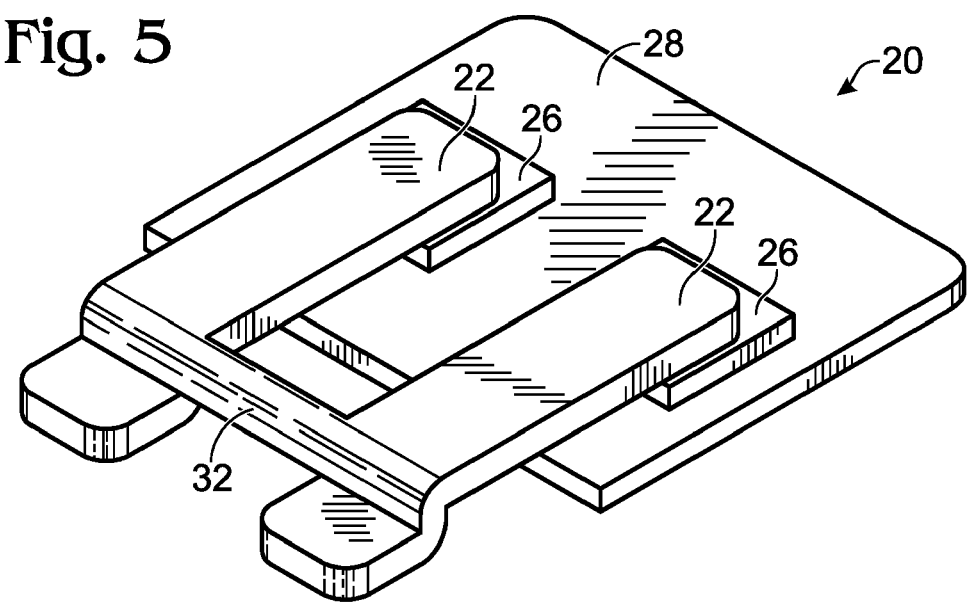
FIG. 5 is a view schematically illustrating an example of the twin-chip-mounting type diode of the present invention while omitting illustration of a covering insulating resin.
Figure 6:
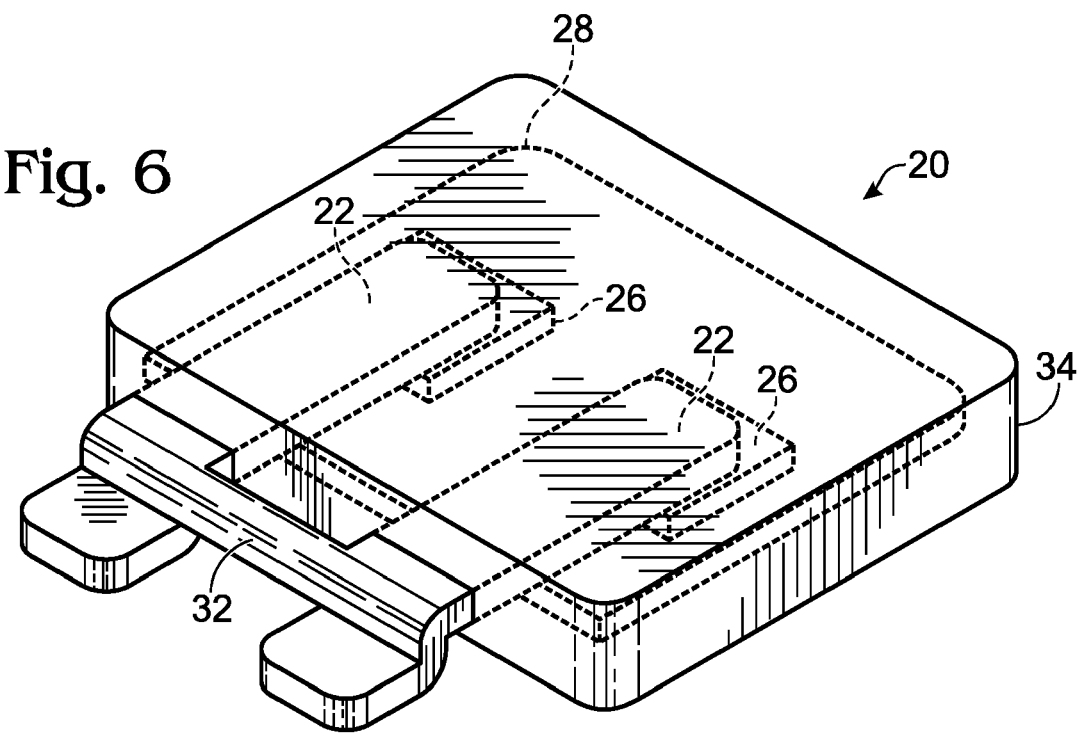
FIG. 6 is a view schematically illustrating an example of the twin-chip-mounting type diode of the present invention without omitting illustration of a covering insulating resin.
Figure 7:
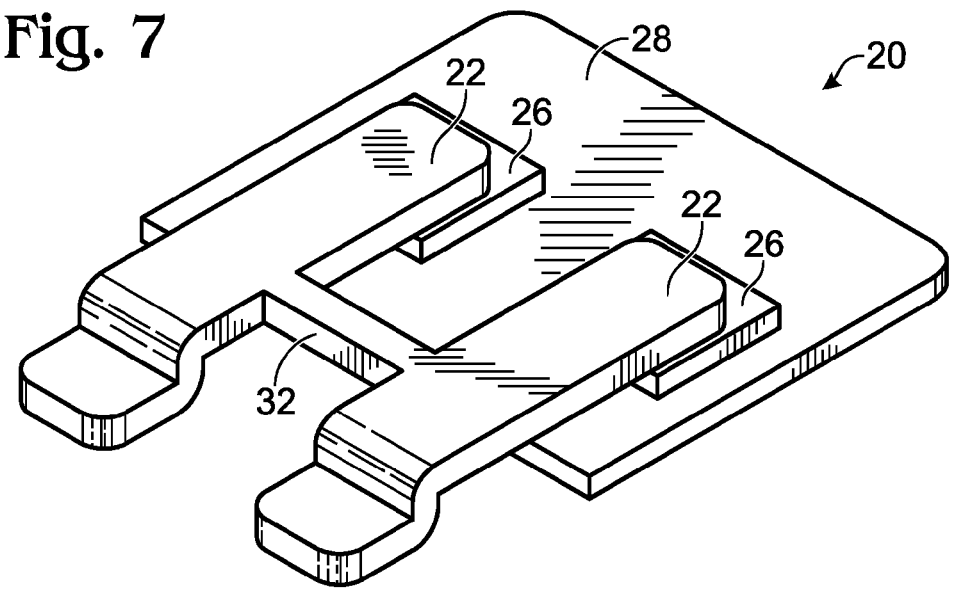
FIG. 7 is a view schematically illustrating an example of the twin-chip-mounting type diode of the present invention while omitting illustration of a covering insulating resin.
Figure 8:
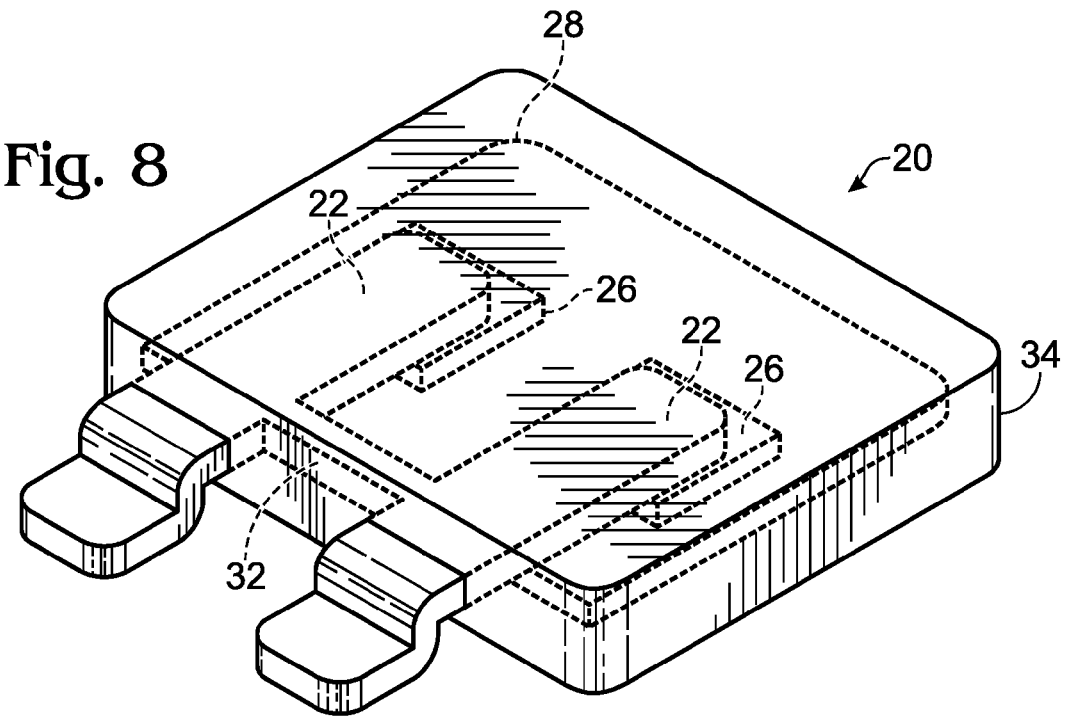
FIG. 8 is a view schematically illustrating an example of the twin-chip-mounting type diode of the present invention without omitting illustration of a covering insulating resin.

In FIG. 2, the electrical connection of the lead feet is achieved between the inner lead feet. However, in the present invention, as shown in the schematic view of FIG. 3, the electrical connection may be achieved between the outer lead feet 24. Alternatively, as shown in the schematic view of FIG. 4, the portion of the inner lead foot may be constructed with wire bonding 30. Still alternatively, as shown in the schematic views of FIGS. 5-8, the lead foot need not be formed from separately-divided parts such as the inner lead foot and the outer lead foot (see FIGS. 5 and 7). Also, after a covering insulating resin 34 is applied, the electrical connection between the lead feet may be seen from the outside (see FIG. 6) or may not be seen from the outside (see FIG. 8). In summary, what is required is that the lead feet are electrically connected with each other in a region of each lead foot from each chip to a portion wherein each lead foot is joined, and that even when a defect is generated at the joining portion of one lead foot, the electric current from the terminal plate can be transmitted to both of the chips via the other lead foot.

By joining the lead feet of the diode of the present invention to a common terminal plate, a terminal plate circuit can be constructed. At this time, the terminal plate can be enlarged so as to sufficiently dissipate the heat generated from the diode. The terminal plate circuit formed in this manner exhibits advantageous effects particularly by being incorporated into a terminal box for solar cell panel that is used in an environment where the temperature change is considerable.

INDUSTRIAL APPLICABILITY

The diode of the present invention is fabricated so as to function sufficiently even when a defect is generated at the joining portion between the terminal plate and the lead foot in an environment where the temperature change is considerable, so that it is extremely useful in a severe environment of use such as a terminal plate circuit within a terminal box for solar cell panel.

The invention claimed is:

1. A diode of twin-chip-mounting type, comprising:
two chips mounted on one frame, wherein each of these chips has a lead foot and each lead foot is separately joined to a common terminal plate of the same pole; and
an independent electrical connection between said lead feet in a region of each lead foot that is disposed between the chip and the terminal plate;
wherein the independent electrical connection between the lead feet is formed by integral molding with each lead foot, so that even when a defect is generated at the joining portion of one lead foot to the terminal plate, the electric current from the terminal plate is transmitted to both of the chips via the other lead foot.

2. A terminal plate circuit, comprising:
a terminal plate; and
a diode of twin-chip-mounting type having two chips mounted on one frame, each of the chips having a lead foot; wherein
said lead feet are electrically connected with each other in a region of each lead foot that is intermediate between each chip and an end of each lead foot, each lead foot of the diode being additionally and separately joined to a common terminal plate of the same pole at said end of the lead foot, and wherein the intermediate electrical connection of the lead feet is formed by integral molding with each lead foot;
so that even when a defect is generated at the joining portion of one lead foot to the terminal plate, the electric current from the terminal plate is transmitted to both of the chips via the other lead foot.

3. The terminal plate circuit according to claim 2, wherein the terminal plate is enlarged so that the heat generated from the diode can be sufficiently dissipated.

4. A terminal plate circuit, comprising:
a terminal plate; and
a diode of twin-chip-mounting type having two chips mounted on one frame, each of the chips having a lead foot, wherein said lead feet are electrically connected with each other in a region of each lead foot that is disposed between the chip and the terminal plate, and each lead foot of the diode is independently and separately joined to a common terminal plate of the same pole, wherein the electrical connection between the lead feet is formed by integral molding with each lead foot;
so that even when a defect is generated at the joining portion of one lead foot to the terminal plate, the electric current from the terminal plate is transmitted to both of the chips via the other lead foot.

5. The terminal plate circuit according to claim 4, wherein the terminal plate is enlarged so that the heat generated from the diode can be sufficiently dissipated.

6. A terminal box for a solar cell panel, comprising the terminal plate circuit according to any one of claims 2, 3, 4 and 5.

* * * * *